United States Patent
Nagano

(10) Patent No.: US 9,653,633 B2
(45) Date of Patent: May 16, 2017

(54) SOLAR CELL, ELECTRONIC DEVICE, AND MANUFACTURING METHOD OF SOLAR CELL

(71) Applicant: SEIKO EPSON CORPORATION, Tokyo (JP)

(72) Inventor: Daisuke Nagano, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/813,520

(22) Filed: Jul. 30, 2015

(65) Prior Publication Data
US 2016/0043256 A1    Feb. 11, 2016

(30) Foreign Application Priority Data
Aug. 6, 2014 (JP) ................................. 2014-160184

(51) Int. Cl.
| | |
|---|---|
| H01L 31/00 | (2006.01) |
| H01L 31/048 | (2014.01) |
| H01L 31/18 | (2006.01) |
| G04G 19/00 | (2006.01) |
| G04C 10/02 | (2006.01) |

(52) U.S. Cl.
CPC ............ H01L 31/048 (2013.01); G04C 10/02 (2013.01); G04G 19/00 (2013.01); H01L 31/18 (2013.01)

(58) Field of Classification Search
CPC ............ H01L 31/048; H01L 31/02002; H01L 31/02008; H01L 31/02013; H01L 31/02005
See application file for complete search history.

(56) References Cited

U.S. PATENT DOCUMENTS

| | | | | | |
|---|---|---|---|---|---|
| 5,252,141 | A * | 10/1993 | Inoue | .................... | B32B 17/02 136/251 |
| 5,679,176 | A * | 10/1997 | Tsuzuki | ............ | H01L 31/03921 136/244 |
| 6,094,404 | A * | 7/2000 | Hidai | .................... | G04B 19/12 136/257 |
| 6,268,558 | B1 * | 7/2001 | Kubota | ................. | H01L 31/046 136/244 |
| 2002/0001020 | A1 * | 1/2002 | Mrvos | .................. | B41J 2/14072 347/65 |
| 2002/0026956 | A1 * | 3/2002 | Hanehira | .............. | H01L 31/048 136/256 |
| 2008/0099869 | A1 * | 5/2008 | Izumi | .................... | G01T 1/2928 257/443 |

FOREIGN PATENT DOCUMENTS

| | | |
|---|---|---|
| JP | 2010-087041 A | 4/2010 |
| JP | 2015-060907 A | 3/2015 |

* cited by examiner

*Primary Examiner* — Eli Mekhlin
(74) *Attorney, Agent, or Firm* — Oliff PLC

(57) ABSTRACT

A power generating film is disposed on a substrate, a transparent conductive film is disposed on the power generating film in an overlapping manner, a first insulating film having a thickness of greater than or equal to 1 μm is disposed on the transparent conductive film, and the substrate is formed into a predetermined shape by irradiating the substrate with laser light which is condensed thereto and by spraying gas onto the substrate.

7 Claims, 11 Drawing Sheets

SOLAR CELL, ELECTRONIC DEVICE, AND MANUFACTURING METHOD OF SOLAR CELL

BACKGROUND

1. Technical Field

This application claims a priority to Japanese Patent Application No. 2014-160184 filed on Aug. 6, 2014 which is hereby expressly incorporated by reference in its entirety.

Several aspects of the present invention relate to a solar cell, an electronic device, and a manufacturing method of a solar cell.

2. Related Art

Laser processing has been widely used in which a metal plate or the like is cut by using laser light. The laser processing includes an XY stage moving a portion which is irradiated with laser light condensed thereon and a plate which is an object to be processed. It is possible to improve processing accuracy by improving the positional accuracy of the XY stage. In addition, the laser processing does not require a fluid drainage facility, and rarely contaminates the environment, compared to an etching method. In addition, the laser processing is not required to manufacture a die, and thus is able to perform production of many kinds in small quantities compared to press blanking.

A method of forming an outer shape of a solar cell by using laser light is disclosed in JP-A-2010-087041. According to this, in the solar cell, a power generating film and a transparent conductive film are disposed on a substrate. Then, an outer circumferential portion of the solar cell is irradiated with laser light having an output of greater than or equal to 200 W, and thus the outer circumferential portion is cut and removed.

When the solar cell is irradiated with the laser light, the subject matter of the solar cell is melted and becomes small pieces, and then the small pieces are blown-off. The small pieces which have been blown-off land on the solar cell. The small pieces are at a high temperature due to the laser light, and thus a temperature at a portion on which the small pieces land increases, and a thermal stress is applied to the portion. When the transparent conductive film or the power generating film is damaged due to the heat, the performance of the solar cell is degraded. Therefore, there has been a demand for a manufacturing method of a solar cell in which the power generating film and the transparent conductive film are able to be prevented from being damaged by heat even when the blown-off subject matter lands on the solar cell.

SUMMARY

An advantage of some aspects of the invention is to solve the problems described above, and the invention can be implemented as the following forms or application examples.

Application Example 1

This application example is directed to a manufacturing method of a solar cell including disposing a power generating film on a substrate, disposing a transparent conductive film on the power generating film in an overlapping manner, disposing a protective film having a thickness of greater than or equal to 1 µm on the transparent conductive film, and forming the substrate into a predetermined shape by irradiating the substrate with laser light condensed thereon and by spraying a gaseous body onto the substrate.

In this application example, the power generating film is disposed on the substrate, and the transparent conductive film is disposed on the power generating film in an overlapping manner. Then, the protective film having a thickness of greater than or equal to 1 µm is disposed on the transparent conductive film. The substrate is formed into a predetermined shape by irradiating the substrate with the laser light condensed thereon and by spraying the gaseous body onto the substrate. At this time, the subject matter of the substrate is heated and dissolved by the laser light. Then, the dissolved subject matter is blown off by the sprayed gaseous body. The blown-off subject matter is heated and thus is at a temperature of higher than or equal to a melting point. When the subject matter of the high temperature lands on the transparent conductive film, the transparent conductive film and the power generating film are damaged, and thus power generation efficiency decreases. The protective film having a thickness of greater than or equal to 1 µm is disposed on the transparent conductive film. Accordingly, it is possible to prevent the power generating film and the transparent conductive film from being damaged by the heat even when the blown-off subject matter lands on the protective film.

Application Example 2

This application example is directed to a solar cell including a substrate including a side surface which is solidified after being melted, a power generating film which is disposed on the substrate, a transparent conductive film which is disposed on the power generating film, and a protective film having a thickness of greater than or equal to 1 µm which is disposed on the transparent conductive film.

In this application example, the power generating film, the transparent conductive film, and the protective film are disposed on the substrate in this order in an overlapping manner. The substrate includes the side surface which is solidified after being melted. That is, the shape of the substrate is formed by melting and cutting the subject matter of the substrate. At this time, the melted subject matter of the substrate is likely to be blown off. The blown-off subject matter is heated, and thus is at a temperature of higher than or equal to a melting point. When the subject matter at a high temperature lands on the transparent conductive film, the transparent conductive film and the power generating film are damaged, and thus power generation efficiency decrease. The protective film having a thickness of greater than or equal to 1 µm is disposed on the transparent conductive film. Accordingly, it is possible to prevent the transparent conductive film from being damaged by the heat even when the blown-off subject matter lands on the protective film.

Application Example 3

This application example is directed to the solar cell according to application example described above, wherein the protective film has light transmissivity.

In this application example, the protective film has light transmissivity. Accordingly, the protective film remains without being peeled off after the shape of the substrate is formed, and thus is able to be utilized as a film for protecting the transparent conductive film.

Application Example 4

This application example is directed to the solar cell according to application example described above, wherein the protective film includes a conductive protective film and an insulating protective film.

In this application example, the protective film is formed of the conductive protective film and the insulating protective film. It is possible to make the transparent conductive film conductive by disposing wiring on the conductive protective film. Then, in the insulating protective film, it is possible to prevent static electricity from entering the transparent conductive film.

Application Example 5

This application example is directed to the solar cell according to application example described above, wherein the insulating protective film exposes a part of the transparent conductive film.

In this application example, the insulating protective film is arranged such that apart of the transparent conductive film is exposed. Accordingly, it is possible to obtain electric power from the transparent conductive film by disposing the conductive protective film and the wiring from the transparent conductive film.

Application Example 6

This application example is directed to an electronic device including an electronic solar cell, wherein the solar cell includes a substrate including a side surface which is solidified after being melted, a power generating film which is disposed on the substrate, a transparent conductive film which is disposed on the power generating film, and a protective film having a thickness of greater than or equal to 1 μm which is disposed on the transparent conductive film.

In this application example, the electronic device includes the solar cell. The power generating film, the transparent conductive film, and the protective film are disposed on the substrate of the solar cell in this order in an overlapping manner. The substrate includes the side surface which is solidified after being melted. That is, the shape of the substrate is formed by melting and cutting the subject matter of the substrate. At this time, the melted subject matter of the substrate is likely to be blown off. The blown-off subject matter is heated and is at a temperature of higher than or equal to a melting point. When the subject matter at a high temperature lands on the transparent conductive film, the transparent conductive film and the power generating film are damaged, and thus power generation efficiency decreases. The protective film having a thickness of greater than or equal to 1 μm is disposed on the transparent conductive film. Accordingly, it is possible to prevent the transparent conductive film from being damaged by the heat even when the blown-off subject matter lands on the protective film. As a result thereof, the electronic device may be a device including a solar cell which is able to prevent the transparent conductive film from being damaged by the heat.

BRIEF DESCRIPTION OF THE DRAWINGS

The invention will be described with reference to the accompanying drawings, wherein like numbers reference like elements.

DESCRIPTION OF EXEMPLARY EMBODIMENTS

In this embodiment, discriminative examples of a solar cell and a manufacturing method of a solar cell will be described with reference to the drawings. Furthermore, each member in each drawing is a recognizable size, and thus the scale size is different for each member.

First Embodiment

Figure 1A:
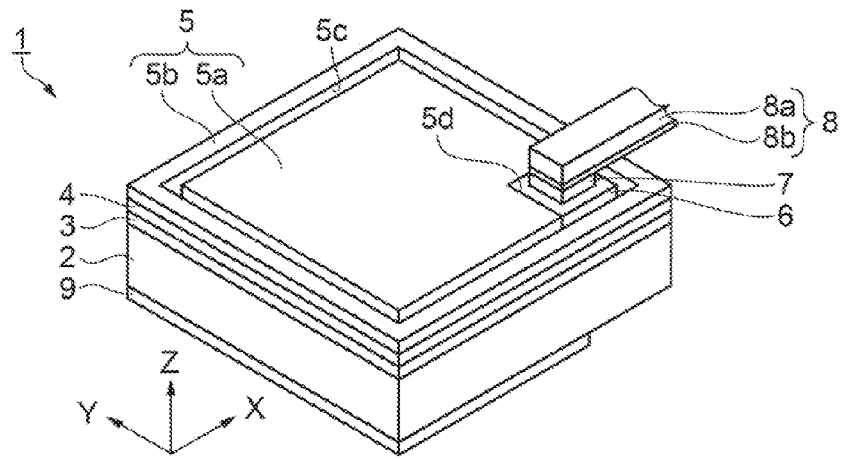
FIG. 1A is a schematic perspective view illustrating a structure of a solar cell according to a first embodiment.

A solar cell according to a first embodiment will be described with reference to FIGS. 1A to 9C. FIG. 1A is a schematic perspective view illustrating a structure of a solar cell. As illustrated in FIG. 1A, a solar cell 1 includes a quadrangular substrate 2. The substrate 2 may be a plate member having conductivity, and as the substrate 2, various metal plates are able to be used. In this embodiment, for example, a stainless steel plate is used as the substrate 2. The stainless steel plate has excellent corrosion resistance, and thus the substrate 2 is rarely oxidized in an environment used in a manufacturing process. A thickness direction of the substrate 2 is a Z direction, and directions in which two orthogonal sides of the substrate 2 extend are an X direction and a Y direction. The side surface of the substrate 2 is a surface which is solidified after being melted.

A power generating film 3, a transparent conductive film 4, and a first insulating film 5 as a protective film and an insulating protective film are disposed on the surface of the substrate 2 on a +Z direction side in this order in an overlapping manner. The power generating film 3 is a film having an electromotive force which receives light and allows electric current to flow. The transparent conductive film 4 is a film having light transmissive properties and conductivity. The type of the transparent conductive film 4 is not particularly limited, and as the transparent conductive film 4, for example, IGO (Indium-Gallium Oxide), ITO (Indium Tin Oxide), and ICO (Indium-Cerium Oxide) are able to be used. In this embodiment, for example, ITO is adopted in the transparent conductive film 4. The first insulating film 5 is a film having light transmissivity and is a film which protects and electrically insulates the transparent conductive film 4. The type of the first insulating film 5 is not particularly limited, and as the first insulating film 5, for example, a resin film of an acrylic resin or the like is able to be used.

The first insulating film 5 includes an effective region insulating film 5a and an ineffective region insulating film 5b. The effective region insulating film 5a is positioned in the center in a plan view seen from the Z direction and is in the shape of an approximately quadrangle. The ineffective region insulating film 5b is disposed to surround the effective region insulating film 5a, and is in the shape of a quadrangular frame. A groove portion 5c having a predetermined distance is disposed between the effective region insulating film 5a and the ineffective region insulating film 5b. The first insulating film 5 includes a cut-out portion 5d which is cut out such that a corner in the X direction and a −Y direction is in the shape of a quadrangle. In the cut-out portion 5d, the transparent conductive film 4 is exposed without being covered with the effective region insulating film 5a. Then, in the cut-out portion 5d, a conductive paste 6 as a conductive protective film and an anisotropic conductive film 7 are disposed on the transparent conductive film 4 in an overlapping manner, and a wiring member 8 is disposed on the anisotropic conductive film 7. In a plan view seen from the Z direction, the conductive paste 6 is arranged to be in contact with the effective region insulating film 5a.

The conductive paste 6 is obtained by dispersing conductive particles in a resin material, and is used by solidifying the resin material. The material of the conductive particles of the conductive paste is not particularly limited, and as the material, carbon particles referred to as carbon black in addition to metal such as silver, and copper, and the like are able to be used. In this embodiment, for example, the carbon particles are used in the material of the conductive particles of the conductive paste.

The anisotropic conductive film 7 is an anisotropic conductive film. The anisotropic conductive film 7 is obtained by dispersing conductive particles in an adhesive material formed of a resin material, and is used by solidifying the resin material. The conductive particles of the anisotropic conductive film 7 are not particularly limited, and as the conductive particles, for example, a spherical body having a diameter of 3 μm to 5 μm in which a nickel layer, and a gold plated layer are stacked on a spherical body of a resin such as a polystyrene from the inner side is able to be used. In addition, metal particles are able to be used.

In the wiring member 8, a metal film 8b is disposed on a flexible substrate 8a, and the metal film 8b is connected to the anisotropic conductive film 7. The flexible substrate 8a is a film-like insulating body, and as the flexible substrate 8a, a polyimide film referred to as a coverlay or a photo-solder resist film, a polyethylene terephthalate resin (PET), and the like are able to be used. The metal film 8b is a metal foil such as a copper foil, and is adhered to the flexible substrate 8a. In addition, a conductive film which is obtained by solidifying a carbon paste, a silver paste, or the like is able to be used in the metal film 8b.

A second insulating film 9 is disposed on the surface of the substrate 2 on a −Z direction side. The second insulating film 9 is not particularly limited insofar as the second insulating film 9 has insulating properties, and as the second insulating film 9, a resin material is able to be used. In this embodiment, for example, a polyester film is used as the second insulating film 9.

It is preferable that the thickness of the first insulating film 5 and the conductive paste 6 is greater than or equal to 1 μm and less than or equal to 50 μm. When the thickness of the first insulating film 5 and the conductive paste 6 is greater than or equal to 1 μm, the first insulating film 5 and the conductive paste 6 function as a protective film for protecting the power generating film 3 and the transparent conductive film 4. When the thickness of the first insulating film 5 and the conductive paste 6 is less than or equal to 50μm, the first insulating film 5 and the conductive paste 6 are able to be easily disposed by using various printing methods such as screen printing. The thickness of the other members is not particularly limited, and in this embodiment, for example, the other members have the following thickness. The thickness of the substrate 2 is 50μm to 200μm, and the thickness of the power generating film 3 is 300 nm to 700 nm. The thickness of the transparent conductive film 4 is 40 nm to 100 nm.

Figure 1B:
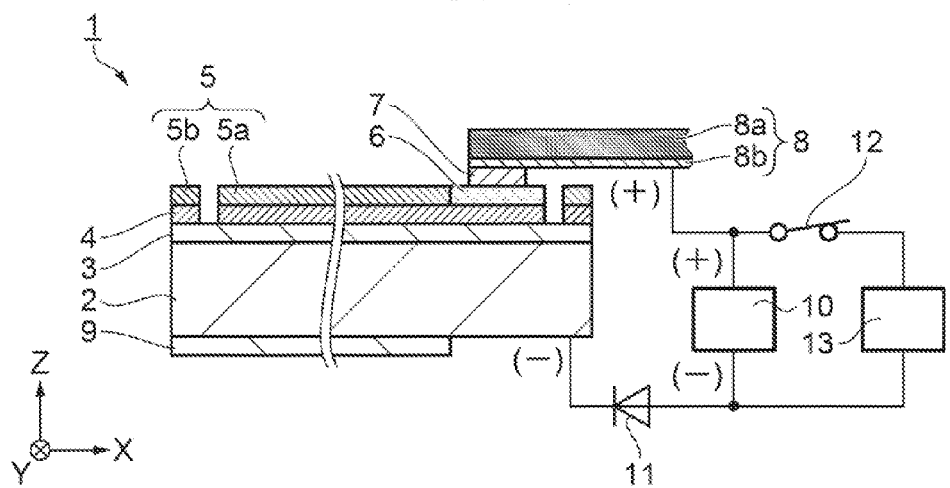
FIG. 1B is a circuit diagram of the solar cell according to the first embodiment.

FIG. 1B is a circuit diagram of the solar cell. As illustrated in FIG. 1B, in the solar cell 1, the wiring member 8 is a (+) electrode and the substrate 2 is a (−) electrode. The wiring member 8 is connected to a (+) electrode of a storage cell 10. The substrate 2 is connected to a (−) electrode of the storage cell 10 through a backward flow prevention diode 11. The backward flow prevention diode 11 is not particularly limited, and in this embodiment, as the backward flow prevention diode 11, for example, a schottky barrier diode is used.

The (+) electrode of the storage cell 10 is connected to a load circuit 13 through a switch 12, and the (−) electrode of the storage cell 10 is connected to the load circuit 13. The circuit is a circuit which energizes the load circuit 13 at the time of closing the switch 12.

Figure 1C:
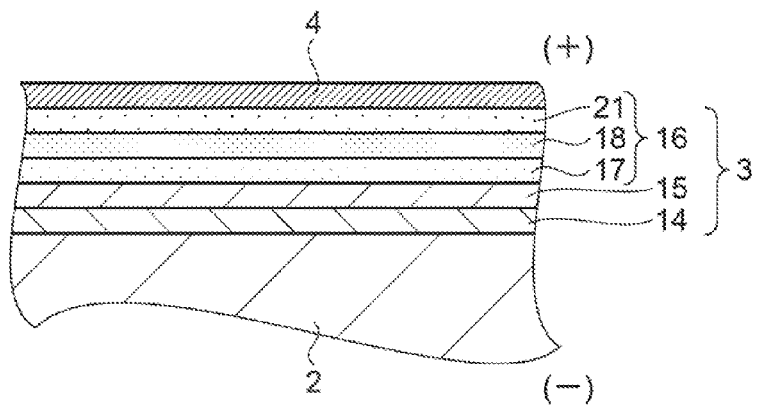
FIG. 1C is a schematic side sectional view of main parts illustrating a structure of a power generating film according to the first embodiment.

FIG. 1C is a schematic side sectional view of main parts illustrating the structure of the power generating film 3. As illustrated in FIG. 1C, the power generating film 3 has a structure in which an aluminum layer 14 (an Al layer), a zinc oxide layer 15 (a ZnO layer), and a semiconductor layer 16 are laminated in this order from the substrate 2 side. Light is incident on the solar cell 1 from the transparent conductive film 4 side (a +Z side). The transparent conductive film 4 functions as a positive electrode. The substrate 2 functions as a negative electrode.

The aluminum layer 14 includes concavities and convexities on the surface thereof, and is a layer on which light which has transmitted the semiconductor layer 16 and the zinc oxide layer 15 among the light incident from the transparent conductive film 4 side is scattered and reflected. The zinc oxide layer 15 is a layer of adjusting the refractive index of the light between the semiconductor layer 16 and the aluminum layer 14.

The semiconductor layer 16 is not particularly limited, and in this embodiment, the semiconductor layer 16, for example, is a multi-junction type power generating layer having a 3-layer structure. The structure is referred to as a triple junction structure. The semiconductor layer 16 has a structure in which a first amorphous silicon germanium layer 17, a second amorphous silicon germanium layer 18, and an amorphous silicon layer 21 are laminated in this order from the zinc oxide layer 15 side.

The first amorphous silicon germanium layer 17 and the second amorphous silicon germanium layer 18 are formed by doping amorphous silicon with germanium. The amount of germanium doped on the first amorphous silicon germanium layer 17 is different from the amount of germanium doped on the second amorphous silicon germanium layer 18. The doping amount of the first amorphous silicon germanium layer 17 is greater than the doping amount of the second amorphous silicon germanium layer 18. Each of the first amorphous silicon germanium layer 17, the second amorphous silicon germanium layer 18, and the amorphous silicon layer 21 is set to have a different absorption wavelength region.

Figure 2A:
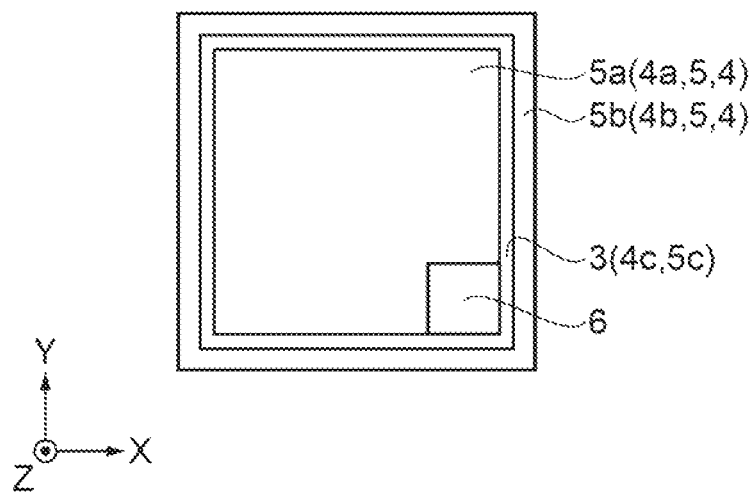
FIG. 2A is a schematic plan view illustrating structures of the power generating film, a transparent conductive film, a first insulating film, and a conductive paste.
Figure 2B:
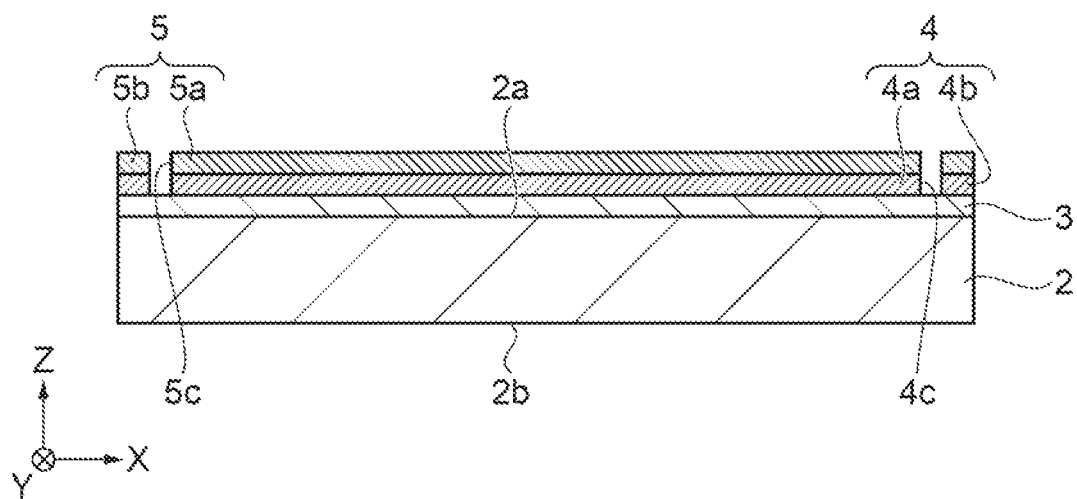
FIG. 2B is a schematic side sectional view illustrating the structures of the power generating film, the transparent conductive film, and the first insulating film.

FIG. 2A is a schematic plan view illustrating the structure of the power generating film, the transparent conductive film, the first insulating film, and the conductive paste. FIG. 2B is a schematic side sectional view illustrating the structures of the power generating film, the transparent conductive film, and the first insulating film. As illustrated in FIGS. 2A and 2B, the transparent conductive film includes a quadrangular effective region 4a which is positioned in the center. A groove portion 4c is disposed around the effective region 4a, and the power generating film 3 is exposed in the groove portion 4c. An ineffective region 4b is disposed around the groove portion 4c. Then, the outer shape of the ineffective region 4b, the outer shape of the power generating film 3, and the outer shape of the substrate 2 are identical to each other.

The effective region 4a is covered with the effective region insulating film 5a and the conductive paste 6. Then, the planar shape of the effective region 4a is identical to a shape in which the conductive paste 6 is disposed the effective region insulating film 5a. The shape of the ineffective region 4b is identical to the shape of the ineffective region insulating film 5b, and the shape of the groove portion 4c is identical to the shape of the groove portion 5c. The effective region insulating film 5a, the ineffective region insulating film 5b, and the conductive paste are protective films for protecting the transparent conductive film 4. Then, the effective region insulating film 5a and the ineffective region insulating film 5b are insulating protective films, and the conductive paste 6 is a conductive protective film. Accordingly, the protective film includes the insulating protective film and the conductive protective film.

The effective region 4a functions as a (+) electrode of the solar cell 1. A part of the ineffective region 4b is able to be in contact with the substrate 2, and the potential of the ineffective region 4b is identical to that of the substrate 2 or is a floating potential. The width of the groove portion 4c and the ineffective region 4b is not particularly limited, and in this embodiment, for example, the width of the groove portion 4c is 50 μm to 200 μm, and the width of the ineffective region 4b is 100 μm to 600μm.

In substrate 2, a surface on which the power generating film 3 is disposed is a first surface 2a, and a surface on which the second insulating film 9 is disposed is a second surface 2b. The second surface 2b functions as a (−) electrode of the solar cell 1.

Figure 3:
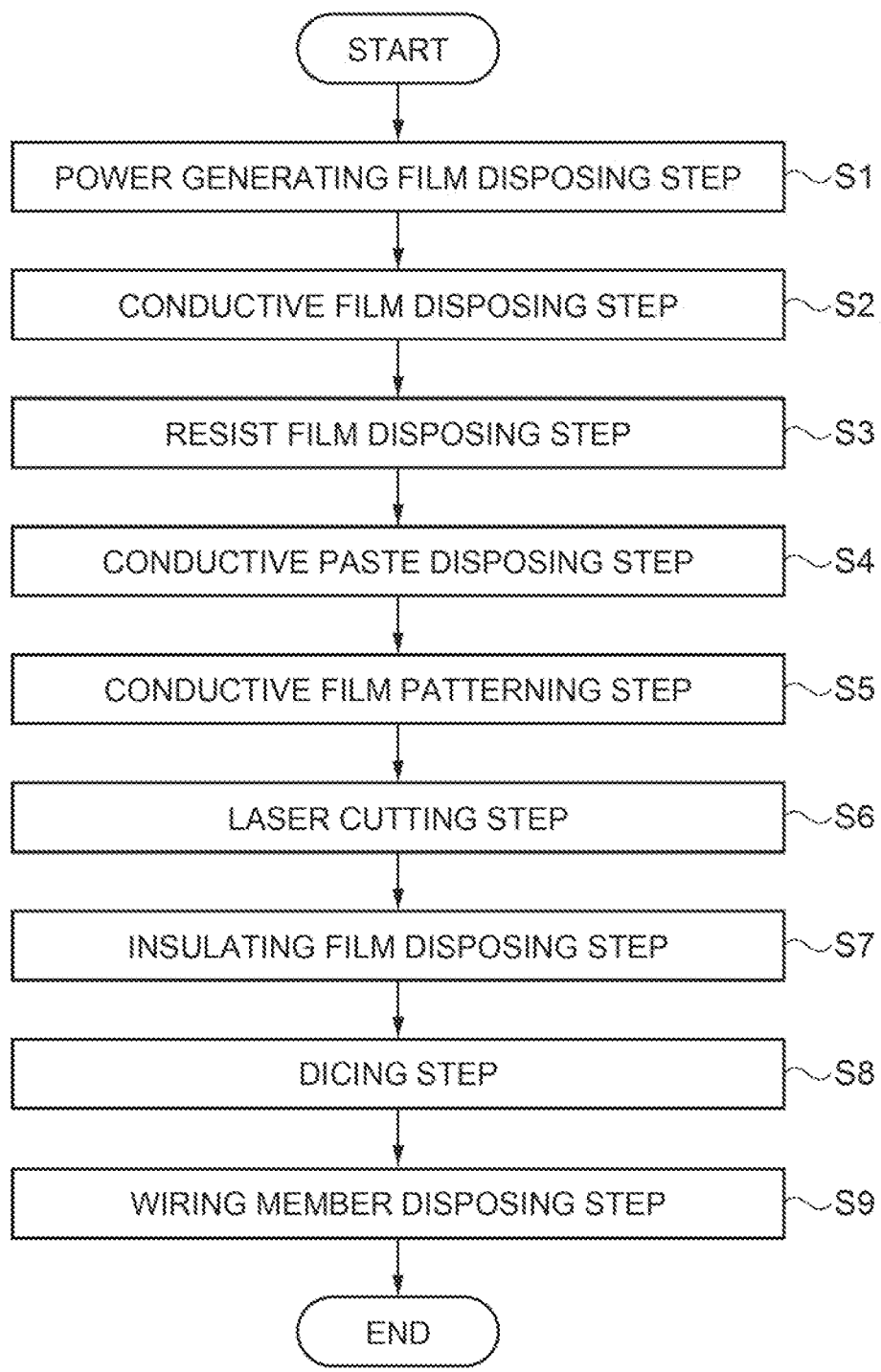
FIG. 3 is a flowchart of a manufacturing method of a solar cell.

Next, the manufacturing method of the solar cell 1 described above will be described with reference to FIGS. 3 to 9C. FIG. 3 is a flowchart of a manufacturing method of a solar cell, and FIGS. 4A to 9D are schematic views for illustrating the manufacturing method of a solar cell. In the flowchart of FIG. 3, Step S1 corresponds to a power generating film disposing step. This step is a step of disposing the power generating film 3 on the substrate 2. Next, the process proceeds to Step S2. Step S2 corresponds to a conductive film disposing step. This step is a step of disposing the transparent conductive film 4 on the power generating film 3. Next, the process proceeds to Step S3. Step S3 corresponds to a resist film disposing step. This step is a step of patterning the first insulating film 5 into a predetermined shape by disposing the first insulating film 5 on the transparent conductive film 4. Next, the process proceeds to Step S4. Step S4 corresponds to a conductive paste disposing step. This step is a step of disposing the conductive paste 6 on the transparent conductive film 4 in the cut-out portion 5d. Next, the process proceeds to Step S5. Step S5 corresponds a conductive film patterning step. This step is a step of patterning the transparent conductive film 4 into a predetermined shape. Next, the process proceeds to Step S6.

Step S6 corresponds to a laser cutting step. This step is a step of cutting the substrate 2, the power generating film 3, the transparent conductive film 4, and the first insulating film 5 into a predetermined shape by using laser light. Next, the process proceeds to Step S7. Step S7 corresponds to an insulating film disposing step. This step is a step of disposing the second insulating film 9 on the substrate 2. Next, the process proceeds to Step S8. Step S8 corresponds to a dicing step. This step is a step of separating and dicing the substrate 2. Next, the process proceeds to Step S9. Step S9 corresponds to a wiring member disposing step. This step is a step of disposing the wiring member 8 on a position where the conductive paste 6 is disposed. The manufacturing process of the solar cell 1 ends through the steps described above.

Next, the manufacturing method will be described in detail with reference to FIGS. 4A to 9C by being associated with the steps illustrated in FIG. 3.

Figure 4A:
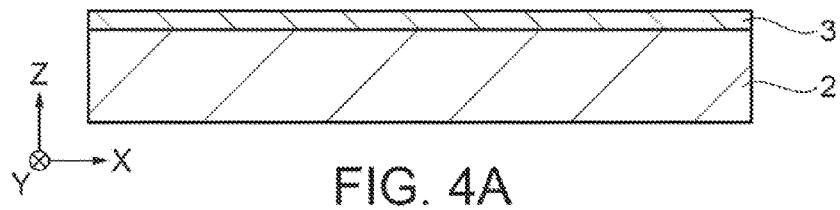
FIGS. 4A to 4D are schematic views for illustrating the manufacturing method of a solar cell.

FIG. 4A is a diagram corresponding to the power generating film disposing step of Step S1. As illustrated in FIG. 4A, the power generating film 3 is disposed on the substrate 2. First, the aluminum layer 14 is formed on the substrate 2 by using aluminum. Concavities and convexities are formed in the surface of the aluminum layer 14 by adjusting film forming conditions. Next, the zinc oxide layer 15 is formed on the aluminum layer 14.

Next, an amorphous silicon film doped with germanium is formed on the zinc oxide layer 15. Accordingly, a first amorphous silicon germanium layer 17 is formed. Further, an amorphous silicon film doped with germanium is formed on the first amorphous silicon germanium layer 17. Accordingly, a second amorphous silicon germanium layer 18 is formed. When the second amorphous silicon germanium layer 18 is formed, the doping amount of germanium is less than that of the first amorphous silicon germanium layer 17.

Next, an amorphous silicon film is formed on the second amorphous silicon germanium layer 18, and thus an amorphous silicon layer 21 is formed. As described above, the power generating film 3 is formed. The film of each layer is able to be manufactured by using a chemical vapor growth method or a deposition method, a physical vapor growth method such as a sputtering method, or the like.

Figure 4B:
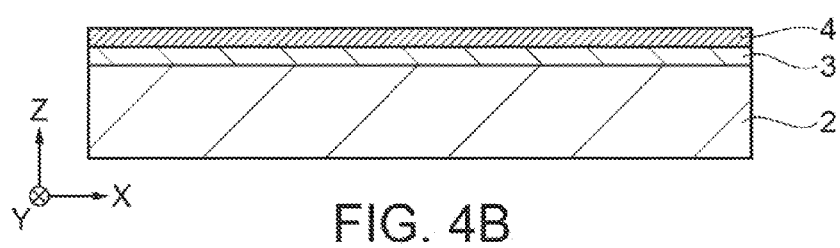

FIG. 4B is a diagram corresponding to the conductive film disposing step of Step S2. As illustrated in FIG. 4B, in Step S2, the transparent conductive film 4 is disposed on the power generating film 3. The transparent conductive film 4 is formed of ITO, and an ITO film is formed on the power generating film 3 in an overlapping manner. The ITO film is able to be manufactured by using a chemical vapor growth method or a deposition method, a physical vapor growth method such as a sputtering method, or the like.

Figure 4C:
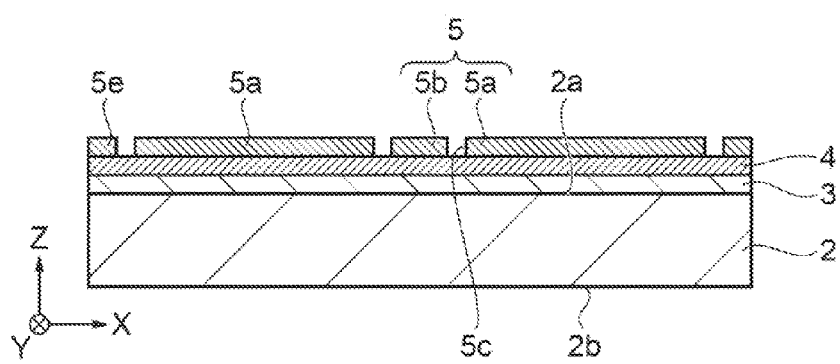
Figure 4D:
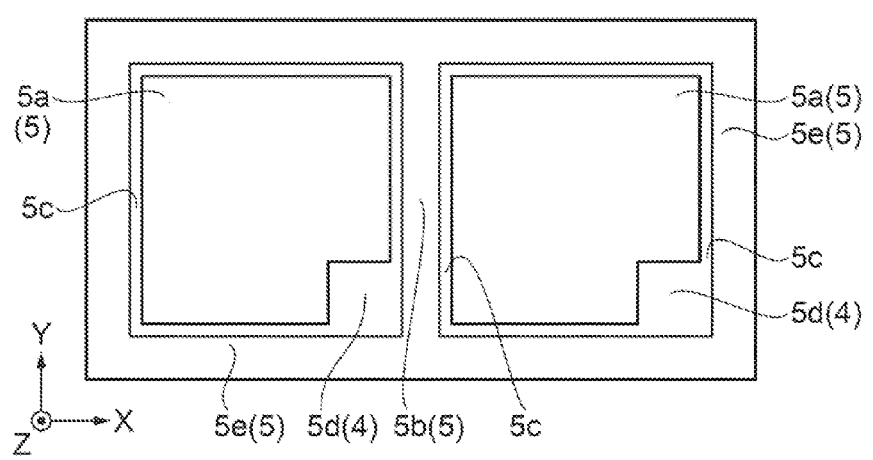

FIG. 4C and FIG. 4D are diagrams corresponding to the resist film disposing step of Step S3. As illustrated in FIG. 4C, the first insulating film 5 is disposed on the transparent conductive film 4. The first insulating film 5 is set by using various printing methods such as screen printing. As the material of the first insulating film 5, a light transmissive resin material is able to be used. The resin material includes a photo-curable or thermosetting additive agent. When the photo-curable resin material is used, the resin material is cured by being irradiated with light after the printing. When the thermosetting resin material is used, the resin material is cured by being heated after the printing.

FIG. 4D illustrates a pattern of the first insulating film 5. The effective region insulating film 5a, the ineffective region insulating film 5b, the groove portion 5c, and a frame film 5e outside the ineffective region are disposed on the first insulating film 5. The frame film 5e outside the ineffective region is a film in which a position along the groove portion 5c becomes the ineffective region insulating film 5b. Then, the frame film 5e outside the ineffective region includes a portion which becomes the frame on outer circumference side. The cut-out portion 5d is disposed on a corner of the effective region insulating film 5a on an X side and a −Y side.

Figure 5A:
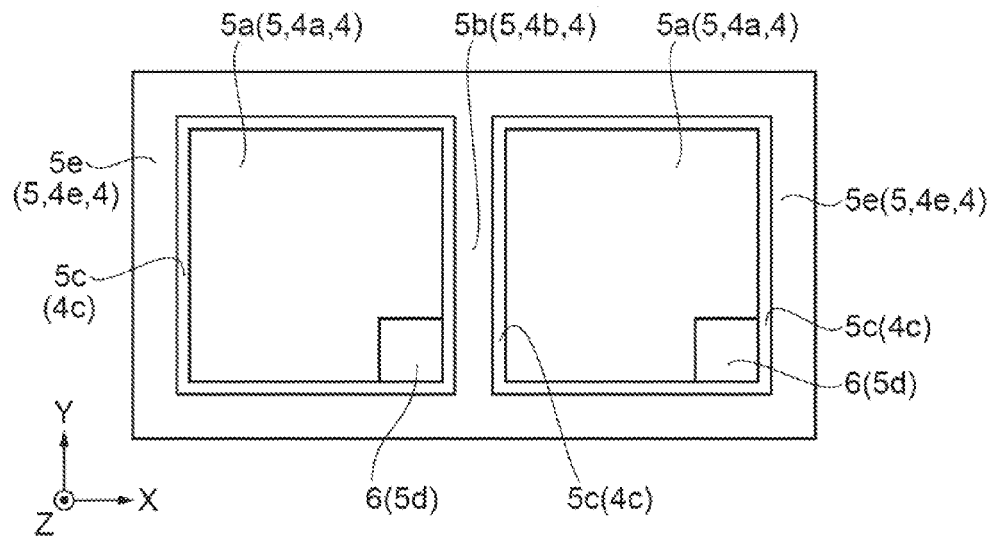
FIGS. 5A to 5C are schematic views for illustrating the manufacturing method of a solar cell.
Figure 5B:
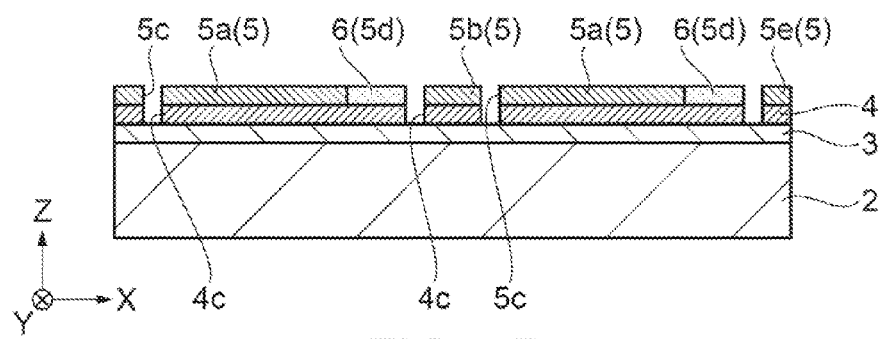

FIGS. 5A and 5B are diagrams corresponding to the conductive paste disposing step of Step S4 and the conductive film patterning step of Step S5. As illustrated in FIGS. 5A and 5B, in Step S4, the conductive paste 6 is disposed on the cut-out portion 5d which is positioned on one corner of the effective region insulating film 5a. The conductive paste 6 is able to be disposed by various printing methods, and the printing method is not particularly limited. In this embodiment, for example, the conductive paste 6 is disposed by using a screen printing method. Next, the conductive paste 6 is heated and dried, and thus is solidified. A heating temperature and a drying time are not particularly limited, and in this embodiment, for example, the heating temperature is approximately 150° C., and the drying time is approximately 30 minutes.

Next, in Step S5, the transparent conductive film 4 is etched. When the transparent conductive film 4 is formed of ITO or IGO, the transparent conductive film 4 is etched by using an oxalic acid-based etching liquid. Furthermore, when the second surface 2b of the substrate 2 is corroded by an etching liquid for the transparent conductive film 4, a protective film may be attached to the second surface 2b. Then, the protective film is removed after the etching.

The first insulating film 5 and the conductive paste 6 function as a resist, and thus the transparent conductive film 4 is etched. Accordingly, the groove portion 4c is formed on the transparent conductive film 4. Then, the effective region 4a is separated from the ineffective region 4b and a frame portion 4e outside the ineffective region by the groove portion 4c. The frame portion 4e outside the ineffective region is a portion in which a position along the groove portion 4c becomes the ineffective region 4b. The conductive paste 6 and the effective region insulating film 5a are arranged to be in contact with each other. Accordingly, the transparent conductive film 4 is a film in which a position facing the conductive paste 6 is integrated with a position facing the effective region insulating film 5a.

Figure 5C:
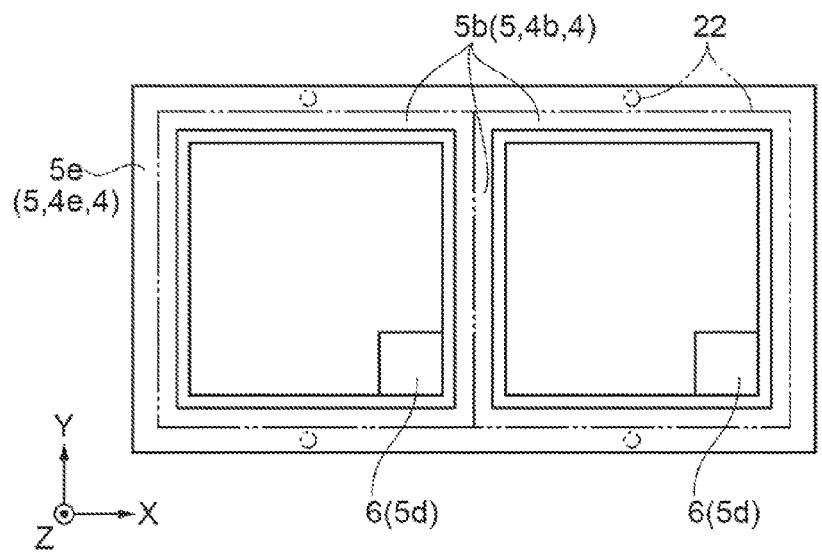

FIGS. 5C to 8B are diagrams corresponding to the laser cutting step of Step S6. As illustrated in FIG. 5C, in Step S6, an intended cutting line 22 is disposed. The intended cutting line 22 is a line along an outer circumference of the ineffective region 4b and the ineffective region insulating film 5b. Further, the intended cutting line 22 includes a line for forming a positioning hole.

Figure 6:
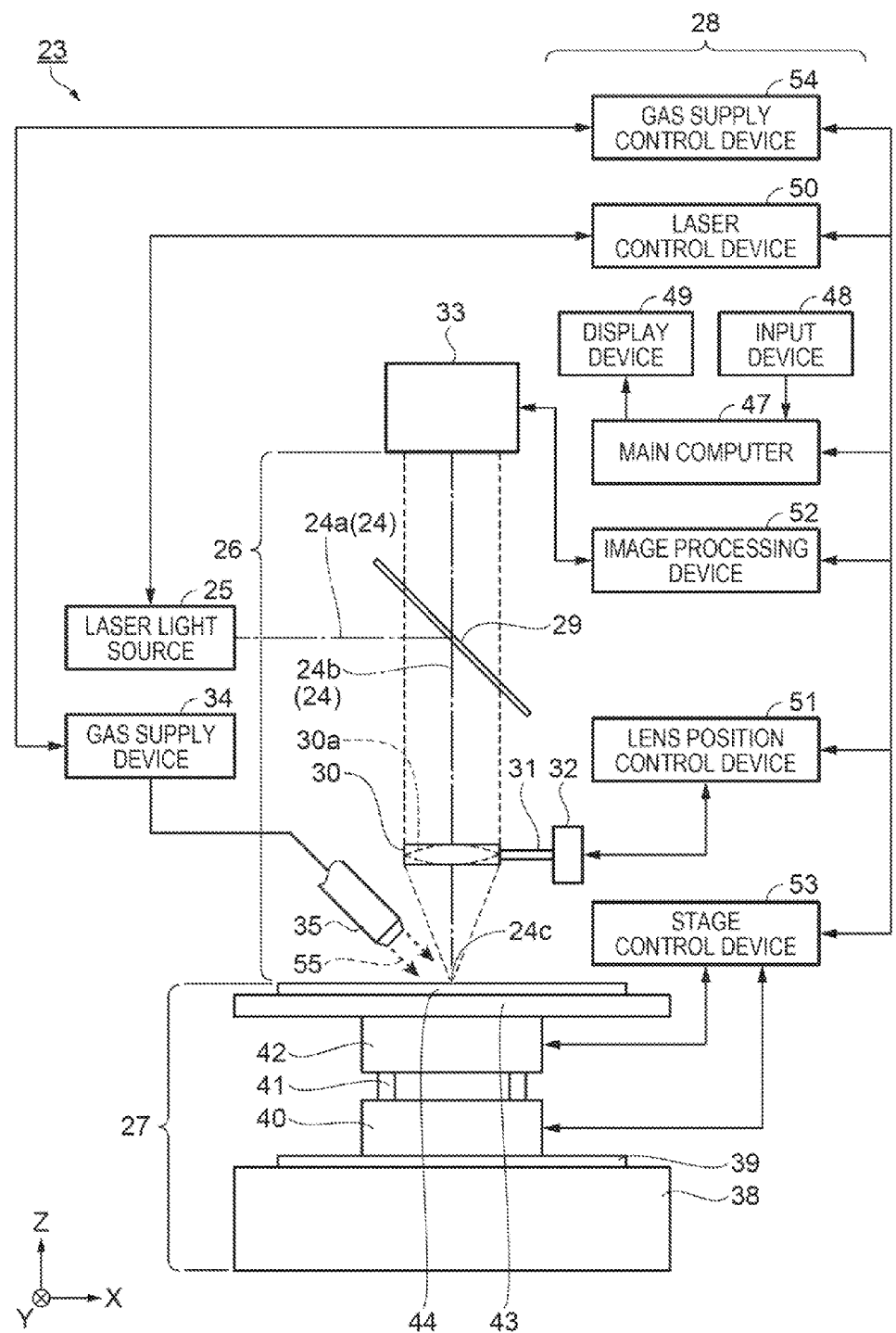
FIGS. 6 is schematic view for illustrating the manufacturing method of a solar cell.

FIG. 6 is a block diagram illustrating a structure of a laser cutting device used in Step S6. As illustrated in FIG. 6, the laser cutting device 23 mainly includes a laser light source 25 which emits laser light 24, an optical path portion 26 which irradiates a workpiece with the emitted laser light 24, a table portion 27 which relatively moves the workpiece with respect to the optical path portion 26, and a control device 28 which controls an operation.

The laser light source 25 may be a light source which is able to cut a processing target by condensing the emitted laser light 24 on the processing target. For example, in this embodiment, laser of carbonic acid gas is adopted in the laser light source 25. The laser cutting device 23 is able to emit the laser light 24 having an output of approximately 20 W.

The optical path portion 26 includes a half mirror 29. The half mirror 29 is arranged on an optical axis 24a of the laser light 24 emitted from the laser light source 25. The half mirror 29 reflects the laser light 24 emitted from the laser light source 25, and changes a traveling direction to the optical axis 24b. A condensing portion 30 is arranged on the optical axis 24b through which the laser light 24 reflected on the half mirror 29 passes. The condensing portion 30 includes a condense lens 30a which is a convex lens therein, and is able to condense the laser light 24 on a condensing position 24c.

The condensing portion 30 is supported on a lens moving mechanism 32 by a lens supporting portion 31. The lens moving mechanism 32 includes a linear motion mechanism (not illustrated), and moves the condensing portion 30 in a direction of the optical axis 24b (the Z direction in the drawing), and thus moves the condensing position 24c on which the laser light 24 which has passed through the condensing portion 30 is condensed.

The linear motion mechanism, for example, is a screw type linear motion mechanism including a screw shaft (a driving shaft) extending in the Z direction, and a ball nut into which the screw shaft is screwed, and the driving shaft is connected to a Z-axis motor (not illustrated) which receives a predetermined pulse signal and is normally rotated in a predetermined step unit. Then, when a driving signal corresponding to a predetermined number of steps is input into the Z-axis motor, the Z-axis motor is rotated normally or reversely, and thus the lens moving mechanism 32 reciprocates along the direction of the optical axis 24b by the number of reciprocations corresponding to the number of steps.

An image capturing device 33 is provided on an extended line of the optical axis 24b passing through the condensing portion 30 and the half mirror 29 on a side opposite to the condensing portion 30 with respect to the half mirror 29. In the image capturing device 33, for example, a coaxial vertical light source (not illustrated) and a Charge Coupled Device (CCD) are embedded. Visible light emitted from the coaxial vertical light source passes through the condensing portion 30 and is emitted to the workpiece 44. The image capturing device 33 is able to perform image capturing with respect to the workpiece 44 through the condensing portion 30 and the half mirror 29.

The laser cutting device 23 includes a gas supply device 34. The gas supply device 34 is connected to a nozzle 35 through pipe fitting. The gas supply device 34 supplies nitrogen gas to the nozzle 35, and sprays the nitrogen gas onto the condensing position 24c from the nozzle 35. The gas pressure of the spraying is not particularly limited, and in this embodiment, for example, the gas pressure is approximately 0.4 MPa.

The table portion 27 includes a base 38. A rail 39 is convexly arranged on the optical path portion 26 side of the base 38, and an X-axis slide 40 is arranged on the rail 39. The X-axis slide 40 includes a linear motion mechanism (not illustrated), and is able to be moved on the rail 39 in the X direction. The linear motion mechanism of the X-axis slide 40 is a mechanism identical to the linear motion mechanism provided in the lens moving mechanism 32. The X-axis slide 40 reciprocates along the X direction according to the driving signal corresponding to a predetermined number of steps by the number of reciprocations corresponding to the number of steps.

A rail 41 is convexly arranged on the optical path portion 26 side of the X-axis slide 40, and a Y-axis slide 42 is arranged on the rail 41. The Y-axis slide 42 includes a linear motion mechanism identical to that of the X-axis slide 40, and is moved on the rail 41 in the Y direction.

A stage 43 is arranged on the optical path portion 26 side of the Y-axis slide 42, and a suction type chuck mechanism (not illustrated) is disposed on an upper surface of the stage 43. Then, when the workpiece 44 is mounted, the workpiece 44 is positioned and fixed onto a predetermined position in the upper surface of the stage 43 by the chuck mechanism.

The control device 28 includes a main computer 47. The main computer 47 includes a Central Processing Unit (CPU) or a memory (not illustrated) therein. The CPU controls the operation of the laser cutting device 23 according to program software stored in the memory.

The main computer 47 includes an input and output interface (not illustrated), and is connected to an input device 48, a display device 49, a laser control device 50, a lens position control device 51, an image processing device 52, a stage control device 53, and a gas supply control device 54.

The input device 48 is a device which inputs data of various processing conditions used at the time of performing laser processing, and the display device 49 is a device which displays various information items at the time of performing the laser processing. The CPU performs the laser processing according to the various processing conditions which are input and the program software, and displays a processing situation on the display device 49. An operator reads the various information items displayed on the display device 49, confirms the laser processing situation, and operates the laser processing.

The laser control device 50 is a device which controls the pulse width and the pulse period of the pulse signal for driving the laser light source 25, the start and the stop of an output, and the like, and is controlled by a control signal of the main computer 47. Furthermore, an oscillation mode of the laser light source 25 may be continuous oscillation or pulse oscillation. Oscillation conditions are not particularly limited.

The lens position control device 51 is a device which controls the movement and the stop of the lens moving mechanism 32. The lens moving mechanism 32 includes a position sensor (not illustrated) which detects a movement distance therein. The lens position control device 51 detects the output of the position sensor, and thus recognizes the position of the condensing portion 30 in the direction of the optical axis 24b. The lens position control device 51 transmits the pulse signal to the lens moving mechanism 32, and thus the lens moving mechanism 32 is able to be moved to a desired position.

The image processing device 52 has a function of calculating image data output from the image capturing device 33. The image processing device 52 calculates the contrast of the captured image, and transmits contrast data to the main computer 47. The main computer 47 moves the condensing portion 30 in the direction of the optical axis 24b, and detects the position of the condensing portion 30 at the time that the image captured by the image capturing device 33 becomes vivid by using the position sensor included therein. Accordingly, the main computer 47 detects a focusing position. Then, the control device 28 emits the condensed laser light 24 onto the condensing position 24c.

The stage control device 53 acquires position information of the X-axis slide 40 and the Y-axis slide 42, and controls the movement. The X-axis slide 40 and the Y-axis slide 42 include a position sensor (not illustrated) therein, and the stage control device 53 detects the position of the X-axis slide 40 and the Y-axis slide 42 by detecting the output of the position sensor. The stage control device 53 acquires the position information of the X-axis slide 40 and the Y-axis slide 42, compares position information items instructed from the main computer 47, and drives and moves the X-axis slide 40 and the Y-axis slide 42 according to a distance corresponding to a difference between the position information items. The stage control device 53 drives the X-axis slide 40 and the Y-axis slide 42, and is able to move the workpiece 44 to a desired position.

The stage control device 53 moves the workpiece 44 in XY directions, and controls a position of the workpiece 44 which is irradiated with the laser light 24. The image processing device 52 detects a distance between the condensing portion 30 and the workpiece 44. The lens position control device 51 controls the distance between the condensing portion 30 and the workpiece 44 on the basis of the detected distance. Subsequently, the laser control device 50 controls the laser light source 25 and emits the laser light 24. The emitted laser light 24 transmits the optical path portion 26 and is emitted to the workpiece 44. By performing the control described above, it is possible to condense and emit the laser light 24 onto a desired position.

A gaseous body 55 of nitrogen gas is sprayed from the nozzle 35. In the condensing position 24c, the workpiece 44 is heated and melted. Then, a member of the melted workpiece 44 is blown off by the gaseous body 55. Then, in the condensing position 24c, the member of the workpiece 44 is removed, and thus a hole is able to be obtained. Then, the table portion 27 is driven and the workpiece 44 is moved, and thus it is possible to cut the workpiece 44. In this embodiment, for example, it is possible to cut the substrate 2 at a processing speed of 1 m/min by the laser cutting device 23.

Figure 7A:
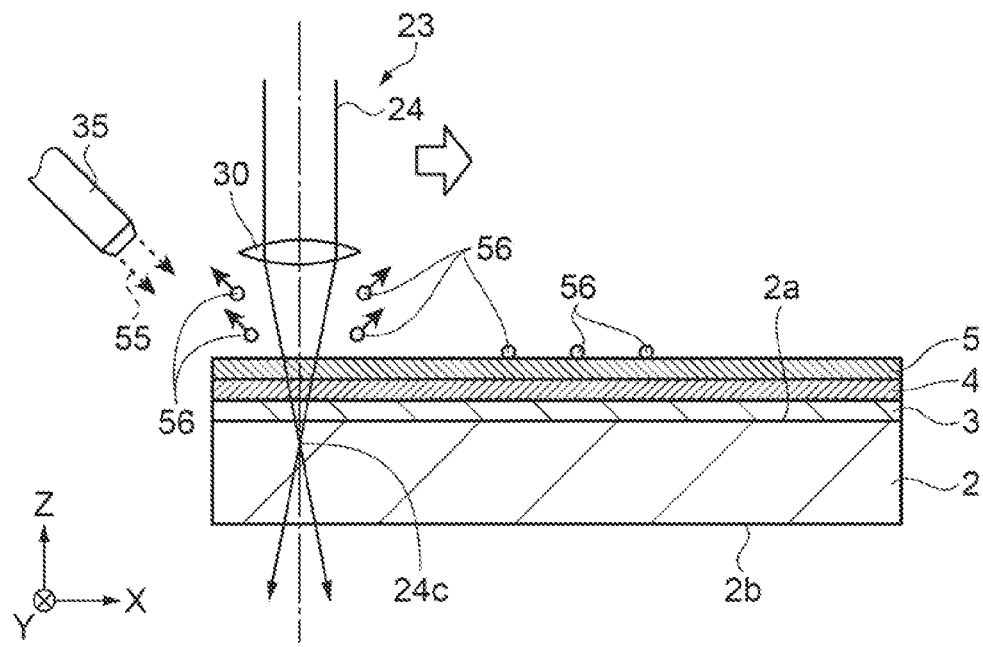
FIGS. 7A and 7B are schematic views for illustrating the manufacturing method of a solar cell.

As illustrated in FIG. 7A, the substrate 2 is irradiated with the laser light 24 from the first insulating film 5 side. Accordingly, the substrate 2, the power generating film 3, the transparent conductive film 4, and the first insulating film 5 are melted, and a molten material 56 is blown off by the gaseous body 55. The molten material 56 is blown off at a temperature of higher than or equal to a melting point. Then, a part of the molten material 56 lands on the first insulating film 5. At this time, the first insulating film 5 and the conductive paste 6 function as a protective film, and thus protect the transparent conductive film 4 and the power generating film 3 from the molten material 56. The thickness of the first insulating film 5 and the conductive paste 6 is greater than or equal to 1 μm, and thus it is possible to prevent the transparent conductive film 4 and the power generating film 3 from being damaged by the heat of the molten material 56.

Figure 7B:
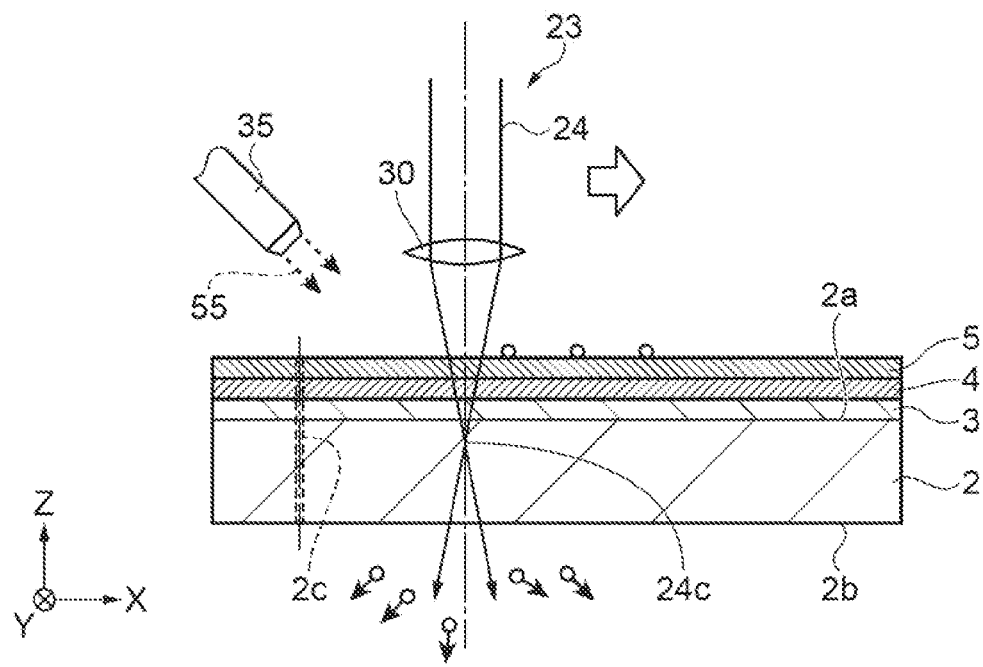

As illustrated in FIG. 7B, a hole 2c is formed on the substrate 2, and then the gaseous body 55 is directed towards the hole 2c. A hole 2c which is initially pierced by irradiating the substrate 2 with the laser light 24 is referred to as a pierce hole. Accordingly, the molten material 56 passes through the hole 2c and is blown off from the second surface 2b of the substrate 2 to the −Z direction side. When it is intended that the molten material 56 does not land on the substrate 2 on the −Z direction side, a protective film may be disposed on the second surface 2b of the substrate 2. After the pierce hole is formed, the condensing position 24c is moved along the intended cutting line 22.

Figure 8A:
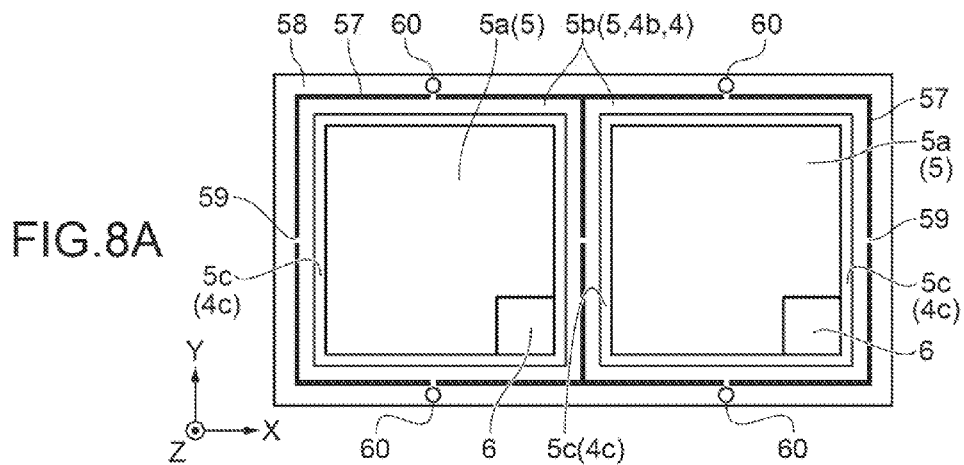
FIGS. 8A to 8D are schematic views for illustrating the manufacturing method of a solar cell.
Figure 8B:
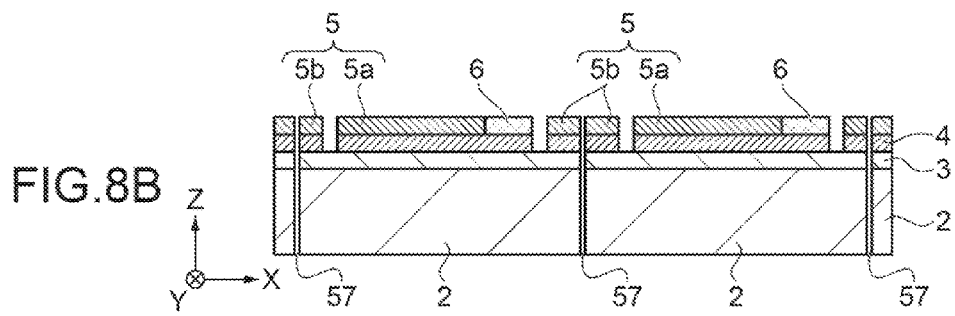

As a result thereof, as illustrated in FIGS. 8A and 8B, a separating hole 57 is formed on the substrate 2 along the intended cutting line 22. The groove portion 5c side of the separating hole 57 is a position corresponding to the ineffective region insulating film 5b and the ineffective region 4b. The outer circumference side of the separating hole 57 is a frame body 58. The frame body 58 and the ineffective region 4b are connected by a connection portion 59. Two ineffective regions 4b disposed in the drawing are connected by the connection portion 59. Accordingly, four connection portions 59 are disposed in the ineffective region 4b. In the separating hole 57, the side surface of the substrate 2 is a surface which is melted and then is solidified.

A positioning hole 60 is formed on the frame body 58 by the laser cutting device 23. Two positioning holes 60 are formed with respect to one effective region insulating film 5a, and the position of the effective region insulating film 5a and the wiring member 8 are able to be recognized on the basis of the positioning hole 60.

Figure 8C:
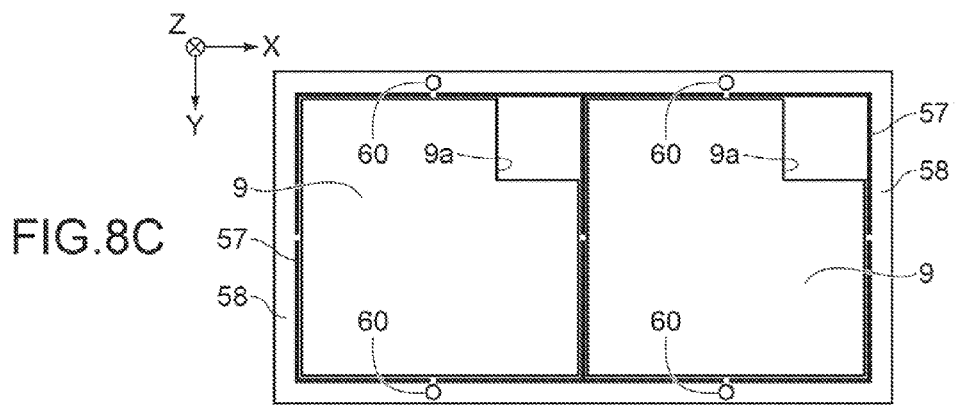
Figure 8D:
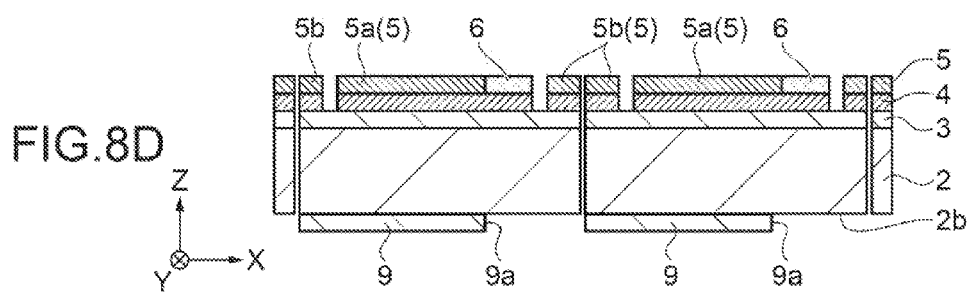

FIGS. 8C and 8D are diagrams corresponding to the insulating film disposing step of Step S7. As illustrated in FIGS. 8C and 8D, in Step S7, the second insulating film 9 is disposed on the second surface 2b of the substrate 2. In the second insulating film 9, a position facing the conductive paste 6 is removed, and thus becomes a cut-out portion 9a. In the cut-out portion 9a, the substrate 2 is used as a contact point of a (−) electrode. The second insulating film 9 is disposed in order to cover the second surface 2b of the substrate 2 other than the cut-out portion 9a.

The second insulating film 9 is a polyester film onto which an adhesive material is applied. A surface onto which the adhesive material is applied is directed towards the substrate 2, and the second insulating film 9 is disposed on the substrate 2. At this time, the second insulating film 9 is positioned by using the positioning hole 60. The second insulating film 9 is adhered to the substrate 2 by pressing the second insulating film 9. The adhesive material of the second insulating film 9 may be adhered by natural drying or by heating and drying.

Figure 9A:
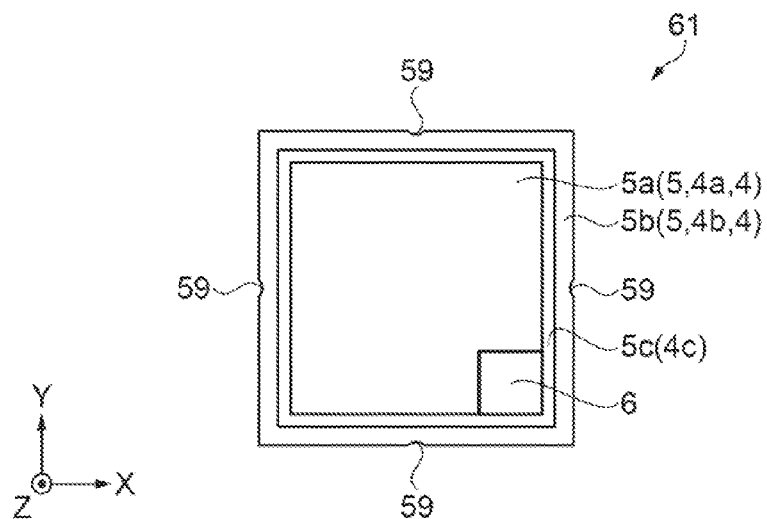
FIGS. 9A to 9C are schematic views for illustrating the manufacturing method of a solar cell.

FIG. 9A is a diagram corresponding to the dicing step of Step S8. As illustrated in FIG. 9A, in Step S8, the connection portion 59 is cut, and a solar cell 61 is separated from the frame body 58. A cutting method of the connection portion 59 is not particularly limited, and in this embodiment, for example, a vibration cutting machine is used in the cutting method. Metal fatigue is applied to the connection portion 59 due to vibration, and thus the connection portion 59 is able to be easily cut. At this time, the position of the connection portion 59 is recognized by using the positioning hole 60.

Figure 9B:
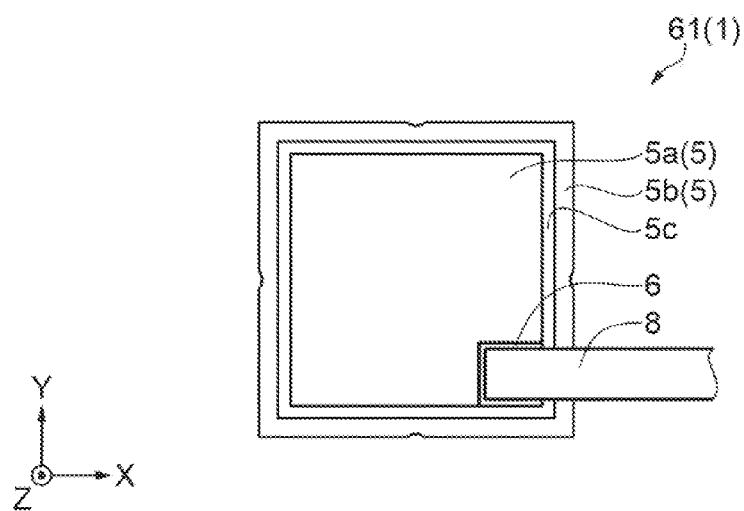
Figure 9C:
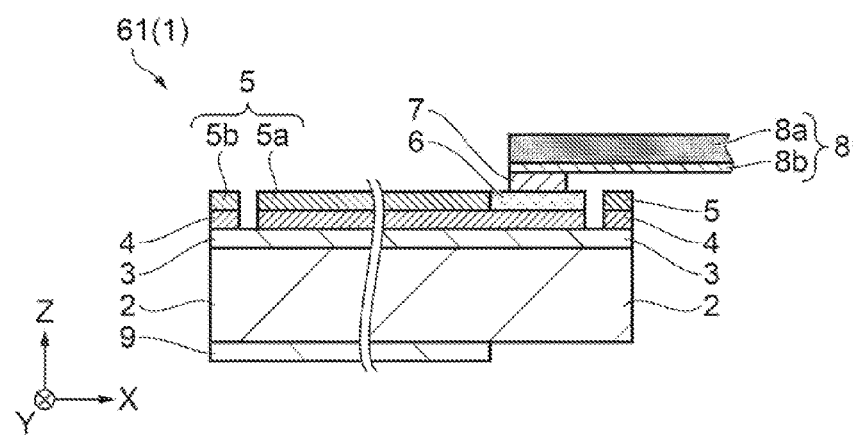

FIGS. 9B and 9C are diagrams corresponding to the wiring member disposing step of Step S9. As illustrated in FIGS. 9B and 9C, in Step S9, the wiring member 8 is disposed on the solar cell 61. First, the anisotropic conductive film 7 is adhered to the metal film 8b of the wiring member 8. In this adhesion, for example, a conductive adhesive material is able to be used.

Next, the anisotropic conductive film 7 is heated while the anisotropic conductive film 7 is disposed on the conductive paste 6 in an overlapping manner and substrate 2 and the wiring member 8 are pressed. A thermosetting adhesive material is included in the anisotropic conductive film 7, and thus it is possible to adhere the wiring member 8 to the solar cell 61. The solar cell 1 is completed through the steps described above.

As described above, according to this embodiment, the following effects are obtained.

(1) According to this embodiment, the substrate 2 is formed into a predetermined shape by irradiating the substrate 2 with the laser light 24 condensed thereon and by spraying the gaseous body 55 onto the substrate 2. At this time, the subject matter of the substrate 2 is dissolved by the laser light 24, and thus becomes the molten material 56. Then, the molten material 56 is blown off by the sprayed gaseous body 55. The blown-off molten material 56 is heated, and thus is at a temperature of higher than or equal to a melting point. When the molten material 56 at a high temperature lands on the transparent conductive film 4, the transparent conductive film 4 and the power generating film 3 are damaged, and thus power generation efficiency decreases. The first insulating film 5 and the conductive paste 6 having a thickness of greater than or equal to 1 µm are disposed on the transparent conductive film 4. Accordingly, it is possible to prevent the transparent conductive film 4 from being damaged by the heat even when the blown-off subject matter lands on the first insulating film 5 or the conductive paste 6.

(2) According to this embodiment, the first insulating film 5 has light transmissivity. Accordingly, the first insulating film 5 remains without being peeled off after the shape of the substrate 2 is formed, and thus is able to be utilized as a film for protecting the transparent conductive film 4.

(3) According to this embodiment, the protective film which protects the effective region 4a and the power generating film 3 is formed of the conductive paste 6 and the first insulating film 5. By disposing the wiring member 8 on the conductive paste 6, it is possible to make the transparent conductive film 4 conductive. Then, in the first insulating film 5, it is possible to prevent static electricity from entering the transparent conductive film 4.

(4) According to this embodiment, the effective region insulating film 5a is arranged such that a part of the transparent conductive film 4 is exposed in the cut-out portion 5d. Accordingly, it is possible to obtain electric power from the transparent conductive film 4 by disposing the conductive paste 6 and the wiring member 8 from the transparent conductive film 4.

(5) According to this embodiment, in the conductive film patterning step of Step S5, the first insulating film 5 and the conductive paste 6 have a function as a mask at the time of etching the transparent conductive film 4. Further, in the laser cutting step of Step S6, the first insulating film 5 and the conductive paste 6 have a function of preventing the power generating film 3 and the transparent conductive film 4 from being damaged by the blown-off molten material 56. Accordingly, it is possible to manufacture the solar cell 1 with high productivity, compared to a method of separately disposing a film utilized in Step S5 and a film utilized in Step S6.

(6) According to this embodiment, the solar cell 1 is formed by laser cutting. In a case of performing blanking in a press die, shape accuracy decreases when the size of the solar cell 1 increases. In the laser cutting, the shape accuracy is determined according to movement accuracy of the table portion 27, and thus it is possible to form a shape having high accuracy compared to the blanking.

Second Embodiment

Next, one embodiment of a timepiece including a solar cell will be described with reference to FIGS. 10A to 11.

Figure 10A:
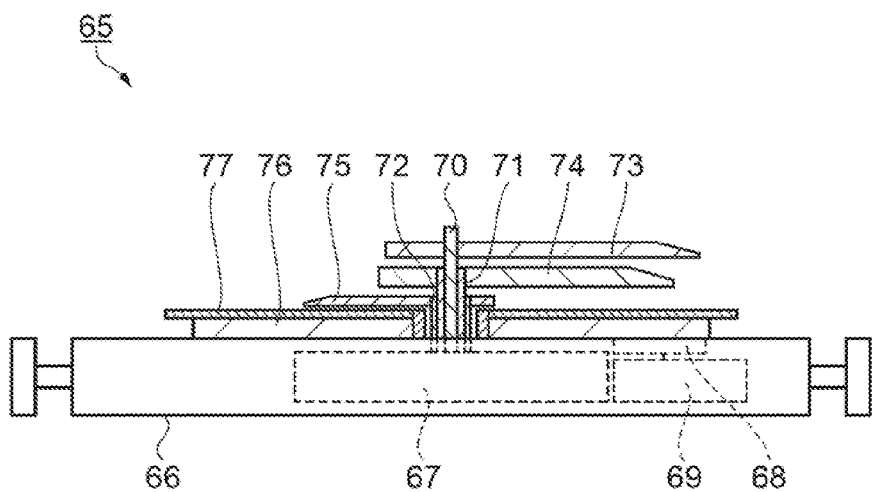
FIG. 10A is a schematic side view illustrating a structure of a timepiece according to a second embodiment.
Figure 10B:
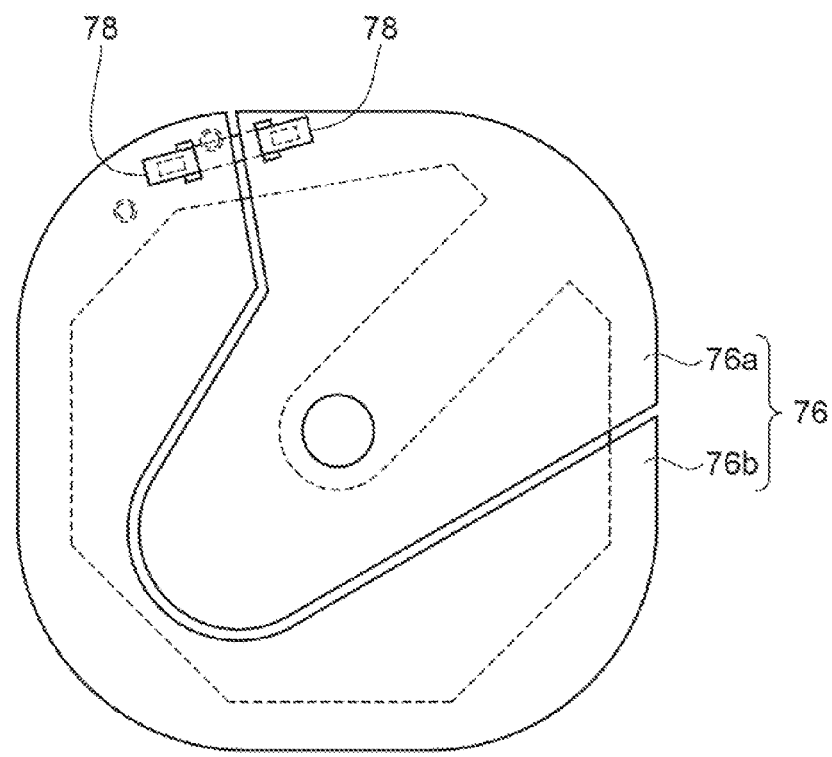
FIG. 10B is a schematic plan view illustrating a structure of a solar cell according to the second embodiment.

FIG. 10A is a schematic side view illustrating a structure of a timepiece, and FIG. 10B is a schematic plan view illustrating a structure of a solar cell. FIGS. 10A and 10B are diagrams in which the outer package of the timepiece is not illustrated. The timepiece of this embodiment includes a solar cell having the same structure as that of the first embodiment. Furthermore, the description of the same parts as those of the first embodiment will be omitted.

That is, in this embodiment, as illustrated in FIGS. 10A and 10B, a timepiece 65 as an electronic device includes a movement 66, and a train wheel 67, a driving circuit 68, a power supply unit 69, and the like are disposed on the movement 66. The movement 66 indicates a portion excluding the outer package, hands, and the like in the timepiece 65. The train wheel 67 is configured of a plurality of gears, and each of the gears is rotated at different number of rotations. A second hand shaft 70, a minute hand shaft 71, and a hour hand shaft 72 protrude from the train wheel 67. A second hand 73 is disposed on the second hand shaft 70, and a minute hand 74 is disposed on the minute hand shaft 71. A hour hand 75 is disposed on the hour hand shaft 72.

A solar cell 76 and a dial plate 77 are disposed on the movement 66 on the hour hand 75 side of the movement 66 in an overlapping manner. A graduation showing hours, minutes, and seconds is disposed on the dial plate 77. The dial plate 77 is configured of a light transmissive material, and the solar cell 76 is irradiated with light with which the timepiece 65 is irradiated. Then, the solar cell 76 receives the light and generates power. The solar cell 76 is connected to the driving circuit 68 by wiring (not illustrated).

The electric power generated by the solar cell 76 passes through the driving circuit 68 and energizes the power supply unit 69. The power supply unit 69 includes a capacitor, and the power supply unit 69 accumulates the electric power generated by the solar cell 76. A motor (not illustrated) is disposed on the driving circuit 68, and the driving circuit 68 drives the motor. At this time, the driving circuit 68 uses the electric power accumulated in the power supply unit 69. The gear in the train wheel 67 is rotated by the motor, and the second hand shaft 70, the minute hand shaft 71, and the hour hand shaft 72 are rotated. As a result thereof, the second hand 73, the minute hand 74, and the hour hand 75 are rotated.

As illustrated in FIG. 10B, the solar cell 76 includes a first solar cell 76a and a second solar cell 76b, and the first solar cell 76a and the second solar cell 76b are connected in series by the wiring member 78.

The solar cell 76 has the same structure as that of the solar cell 1 of the first embodiment. The solar cell 76 includes the substrate 2, and the power generating film 3 and the transparent conductive film 4 are disposed on the first surface 2a of the substrate 2. The first insulating film 5 and the conductive paste 6 having a thickness of greater than or equal to 1 µm are disposed on the substrate 2.

Figure 11:
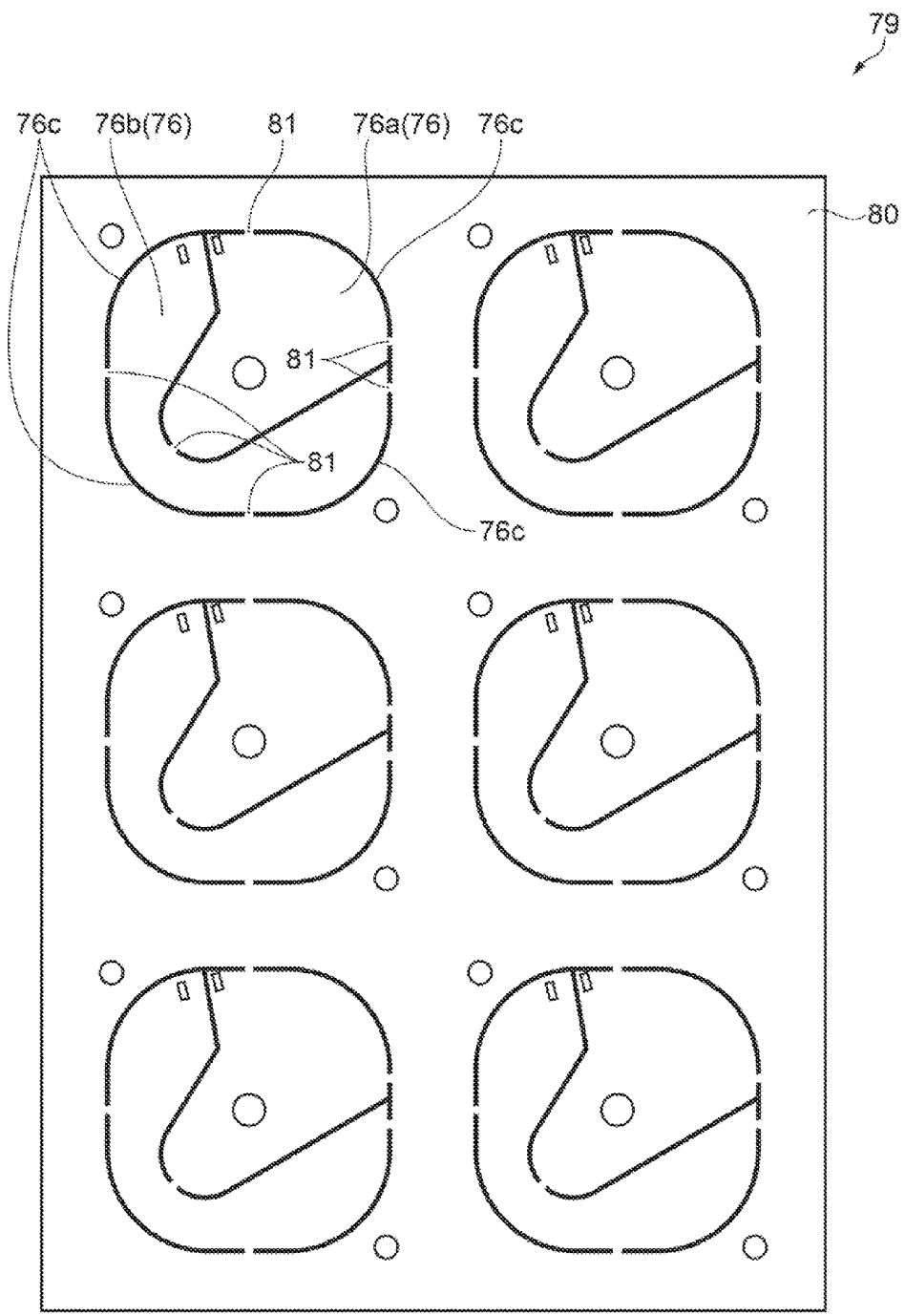
FIG. 11 is a schematic plan view of a solar cell-attached substrate.

FIG. 11 is a schematic plan view of a solar cell-attached substrate, and is a schematic view for illustrating the laser cutting step of Step S6. As illustrated in FIG. 11, a solar cell-attached substrate 79 includes a frame body 80. Six first solar cells 76a and second solar cells 76b are formed on the solar cell-attached substrate 79. The first solar cell 76a is connected to the frame body 80 by a connection portion 81, and the second solar cell 76b is also connected to the frame body 80 by the connection portion 81. The first solar cell 76a and the second solar cell 76b are connected to each other by the connection portion 81.

As with the first embodiment, in the solar cell-attached substrate 79, a hole 76c for forming the outer circumference shape of the first solar cell 76a and the outer circumference shape of the second solar cell 76b is formed by the laser cutting device 23. Then, the first insulating film 5 and the conductive paste 6 having a thickness of greater than or equal to 1 µm are disposed on the substrate 2. Accordingly, even when the molten material 56 which is melted by the laser light 24 is blown off around the condensing position 24c, the power generating film 3 and the transparent conductive film 4 are not damaged. Accordingly, the solar cell 76 is a cell which generates power with excellent quality. As a result thereof, the timepiece 65 may be an electronic device including the solar cell 76 which is able to prevent the power generating film 3 and the transparent conductive film 4 from being damaged by the heat.

Furthermore, this embodiment is not limited to the embodiments described above, and is able to be variously modified or improved by a person with ordinary skill in the art within the technical ideas of the invention. Modification examples are as follows.

Modification Example 1

In the first embodiment, the solar cell 1 is formed of the rectangular substrate 2. The substrate 2 may be an elongated coil material. It is possible to efficiently supply the substrate 2 to a manufacturing device. Furthermore, the coil material is also referred to as a ribbon material or a hoop material.

Modification Example 2

In the first embodiment, the semiconductor layer 16 is the multi-junction type power generating layer having a 3-layer structure. The semiconductor layer 16 may be a layer generating power by light, and various pn junctions and pin junctions may be applied to the semiconductor layer 16.

Modification Example 3

In the first embodiment, the wiring member disposing step of Step S9 is performed after the dicing step of Step S8. However, the invention is not limited thereto, and the dicing step of Step S8 may be performed after the wiring member disposing step of Step S9. The solar cell 61 is attached to the frame body 58, and thus it is possible to grip and move the solar cell 61 through the frame body 58 without being in contact with the solar cell 61.

Modification Example 4

In the first embodiment, the laser cutting step of Step S6 is performed in a state where the power generating film 3 is exposed by the groove portion 4c and the groove portion 5c. The groove portion 4c and the groove portion 5c may be embedded in the insulating film between the conductive film patterning step of Step S5 and the laser cutting step of Step S6. Accordingly, it is possible to prevent the power generating film 3 and the transparent conductive film 4 from being damaged by the groove portion 4c.

Modification Example 5

In the second embodiment, an example of the timepiece 65 including the solar cell 76 is described. In all electronic devices including the solar cell, it is possible to dispose a solar cell which is formed by performing the laser cutting in a state where the first insulating film 5 and the conductive paste 6 are disposed on the first surface 2a side of the substrate 2. As a result thereof, the electronic device is able to include the solar cell which is formed with excellent quality and high productivity. For example a solar cell which is manufactured by the same manufacturing method as that of the solar cell 1 described above is able to be disposed on the electronic device such as a mobile phone, Pedometer (registered trademark), a radio, a television, a digital camera, a camcorder, and a temperature indicator.

What is claimed is:

1. A solar cell, comprising:
    a substrate;
    a semiconductor film having a photoelectric conversion function which is disposed on the substrate;
    a transparent conductive film which is disposed on the semiconductor film;
    a protective film which is disposed on the transparent conductive film, the protective film having a cut-out portion in which the transparent conductive film is exposed;
    a conductive material which is disposed on the transparent conductive film in the cut-out portion; and
    a wiring member which is electrically connected to the transparent conductive film through the conductive material, wherein
    the conductive material is sandwiched between the transparent conductive film and the wiring member, and
    the protective film is in the same horizontal plane as the conductive material.

2. The solar cell according to claim 1,
    wherein the protective film includes a region having conductivity and a region having insulating properties, and
    the region having insulating properties is light transmissive.

3. The solar cell according to claim 1,
    wherein a thickness of the protective film is greater than or equal to 1 μm.

4. An electronic device comprising a solar cell,
    wherein the solar cell is the solar cell according to claim 1.

5. The electronic device according to claim 4,
    wherein the electronic device is a timepiece.

6. The solar cell according to claim 1, further comprising:
    an insulating film which is disposed in a layer in which the protective film is disposed, the insulating film extending along at least one side of the substrate.

7. The solar cell according to claim 1, wherein the cut-out portion is disposed at a corner of the protective film.

* * * * *